United States Patent [19]

Rouberol et al.

[11] Patent Number: 5,038,045
[45] Date of Patent: Aug. 6, 1991

[54] COMPOSITE ELECTROMAGNETIC LENS WITH VARIABLE FOCAL DISTANCE

[75] Inventors: Jean-Michel Rouberol, Saint Germain En Laye; Mathias Tong, St Mande, both of France

[73] Assignee: Cameca, Courbevoie, France

[21] Appl. No.: 489,978

[22] Filed: Mar. 7, 1990

[30] Foreign Application Priority Data

Mar. 21, 1989 [FR] France ................... 89 03674

[51] Int. Cl.$^5$ ................................. H01J 3/22
[52] U.S. Cl. ......................... 250/396 ML; 335/210
[58] Field of Search ............... 250/396 ML, 396 R; 335/210

[56] References Cited

U.S. PATENT DOCUMENTS 4,419,581 12/1983 Nakagawa ............... 250/396 ML

FOREIGN PATENT DOCUMENTS 59-73840 4/1984 Japan ......................... 250/396 ML

OTHER PUBLICATIONS

Patent Abstracts of Japan, vol. 9, No. 219; Sep. 6, 1985, JP 60-79653.
Patent Abstracts of Japan, vol. 8, No. 209, Sep. 22, 1984; JP 59-94350.

Primary Examiner—Jack I. Berman
Attorney, Agent, or Firm—Oblon, Spivak, McClelland, Maier & Neustadt

[57] ABSTRACT

The lens is formed by the association of two electromagnetic lenses sharing one and the same magnetic circuit crossed by one and the same central channel. The first lens is a shielded lens and has an annular gap at one of its ends. This annular gap cuts the central channel along a direction the plane of which is perpendicular to the optical axis. The second lens is a single-pole lens surrounding the annular gap of the first lens. It has an annular gap demarcated by two lips, the walls of which have shapes generated by revolution around the optical axis. Induction coils enable the magnetic flux of the gaps to be made to vary.

3 Claims, 2 Drawing Sheets

COMPOSITE ELECTROMAGNETIC LENS WITH VARIABLE FOCAL DISTANCE

BACKGROUND OF THE INVENTION

1. Field of the Invention

The present invention concerns a composite electromagnetic lens with a variable focal distance enabling a major variation in this focal distance, without shifting either the object or the image, notably the object, which determines the distance from the lens to the object to be observed: this distance is also known by the abbreviation WD (or working distance).

It applies to the making of scanning electron microscopes and/or of instruments derived from scanning microscopes, integrated circuit testers using electron beams or electron microprobes wherein the concentration of the primary electron beams on the objects to be tested or probed is obtained by means of an electromagnetic lens, notably the one called a "beam-focusing objective". For, the optical characteristics of focusing and the sensitivities of the detectors (of electrons) placed in the neighborhood of this lens depends considerably on the axial magnetic field B(Z) produced by this lens.

2. Description of the Prior Art

In these applications, the transmissions of the secondary electrons caused by the impact of the primary electron beams on the objects to be tested are measured by means of detectors placed either beneath the focusing lens forming the objective of the instrument, and above the objects or samples to be tested, or above the objective, the secondary electrons emitted by the objects or the samples being directed through a central channel of the focusing lens forming the objective.

However, since the sensitivity of detection of the secondary electrons depends in each application on the distribution of the magnetic field above the objects or samples to be tested, each focusing lens, specific to an application, is generally unsuited to functioning for other applications, unless a major modification is to be made in the focusing device or in the arrangement of the secondary electron detection devices, whether these devices are of the types known as "Everhart-Thornlay" devices or "In Lens" devices.

Thus, a known way of obtaining a high reduction in the optical aberrations in an electron microscope consists in placing the object to be tested in the strong field zone of the focusing lens, by placing the object to be tested either in the gap of the lens or before another single-pole semi-shielded lens, the chief image plane of which is placed between the front face of the lens and the object to be tested. But neither of the above approaches is appropriate for making, for example, integrated circuit testers as they do not enable the obtaining of an induction field, at the objects to be tested, that is much smaller than the field prevailing in the gap of the lens.

SUMMARY OF THE INVENTION

It is an aim of the invention to overcome the above-mentioned drawbacks.

To this effect, an object of the invention is a composite electromagnetic lens with variable focal distance, comprising a first shielded lens coupled to a second single-pole lens, the two lenses being crossed by one and the same central channel extending around an optical axis common to both lenses, to enable the passage of electrified particles going towards or coming from an object or sample to be observed through the first and second lenses, each lens being provided with an induction coil to shift the position on the optical axis of the resultant composite lens as a function of the excitation current of the induction coils of the first and second lenses.

The chief advantage of the invention is that, by integrating two lenses into a single magnetic block, it makes it possible to obtain a lens with variable focal distance capable of being used in scanning electron microscopes as well as in high-resolution electron microprobes or again in testers of integrated circuits. It also enables the testing of large-sized samples and the modification of the electro-optical characteristics of instruments without thereby in any way necessitating mechanical adjustments such as, for example, adjustments of the distance of the objective above the objects or samples to be tested.

BRIEF DESCRIPTION OF THE DRAWINGS

Other features and advantages of the invention will appear below from the following description, made with reference to the appended drawings, wherein.

DETAILED DESCRIPTION OF THE INVENTION

Figure 1:
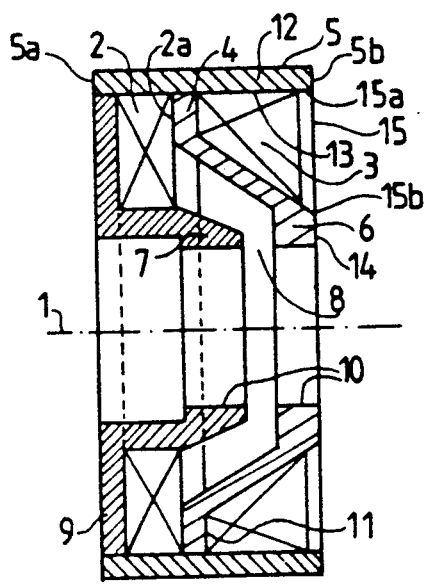
FIG. 1 shows a sectional view of an embodiment of a lens with variable focal distance according to the invention.

The electromagnetic lens with variable focal distance shown in FIG. 1 is formed by the assembly, around one and the same optical axis 1, of two joined electromagnetic lenses, respectively shielded and single-pole, excited by two induction coils 2 and 3, mounted on a magnetic circuit 4 common to both lenses. The first, shielded lens has a shape similar to that of the final lens with which scanning electron microscopes are generally fitted out. It has, inside a body 5 with a preferably cylindrical shape generated by revolution around the optical axis 1, a front pole piece separated from a cylindrical pole piece 7 by an annular gap positioned in a direction, the plane of which is perpendicular to the optical axis 1. The pole piece 7 supports the excitation coil 2. It has a circular support 9 enclosing a first end 5a of the cylindrical body 5 to enable, firstly, the housing of the induction coil 2 in the space demarcated by the cylindrical body 5, the front pole piece 6 and the support 9, as well as, secondly, the flow of the magnetic flux induced by the coil 2 in the magnetic circuit formed by the front pole piece 6, the cylindrical body 5, the gap 8 and the support 9. The front pole piece 6 and the cylindrical pole piece 7 are pierced with a hole 10 forming the central channel of the lens. The hole 10 has its longitudinal axis identical with the optical axis 1, to enable the flow of electrons or, possibly, of any other electrified particles, through the lens along the optical axis 1. The front pole piece 6 has the shape of a truncated cone and is provided with a support 11 lying on a flank 2a of the coil 2 to enable the coil 2 to be moved away from the annular gap 8 and to enable the engagement, within the front part 6, of the end of the pole piece 7 opposite the support 9 to form the annular gap 8.

The second single-pole lens is formed by the coil 3 and that part of the magnetic circuit 4 formed by the front pole piece 6 and the front part 12 of the cylindrical body 5 which surrounds the front pole piece 6. The coil 3 is mounted on the truncated cone of the front pole piece 6 in the space between the front pole piece 6 and the internal part 13 of the cylindrical body 5, to enable the magnetic flow induced by the coil 3 to flow in the magnetic circuit formed by the front pole piece 6, the front part 12 of the cylindrical body 5 and an annular gap 15. The gap 15 is demarcated by the two lips formed by the front part 12 of the cylindrical body 5 and by the conical part of the truncated cone 14. The edges 15a and 15b of the annular gap 15 are located in a plane perpendicular to the optical axis 1. They are located, firstly, at the intersection of the second end 5b of the cylinder 5 and of the interior part 13 and, secondly, at the intersection of the small base 14 of the truncated cone with its conical part.

Figure 2:
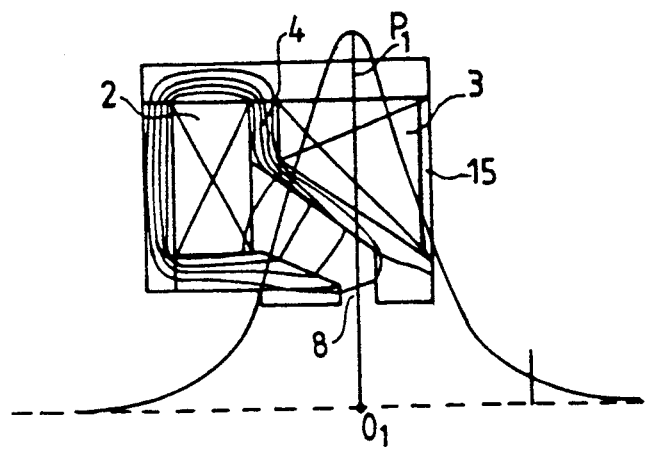
FIGS. 2, 3 and 4 are graphs showing the magnetic flux densities as a function of the excitation current flowing through the induction coils of the lens shown in FIG. 1.

For the convenience of the explanation, it is hereinafter assumed that the two lenses which form the composite lens of the invention are thin lenses, each of them being in a plane perpendicular to the optical axis at the place where the magnetic field that they produce is at its maximum. Thus, the first lens is placed in the neighborhood of the median plane of the gap 8 and goes through the point $O_1$ of FIG. 2. It remains in this position independently of the excitation current of the coil 2.

Figure 3:
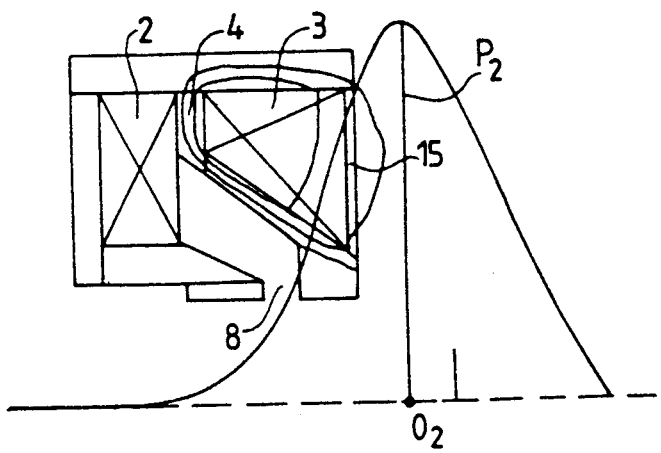

By contrast, the position $O_2$ of the second lens on the optical axis 1 is located, as shown in FIG. 3, before the front pole piece 6 of the lens at the position where the flux given by the gap 15 is the maximum.

Figure 4:
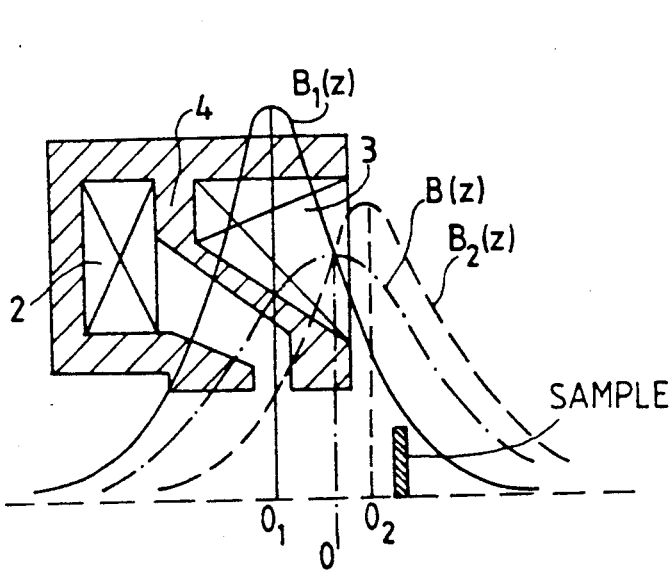
Figure 5:
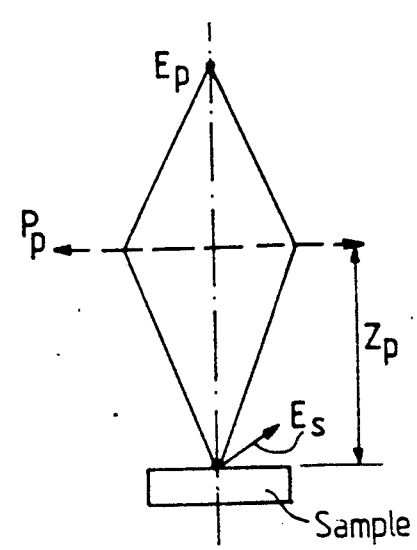
FIG. 5 is an optical diagram representing a focusing of primary electrons on a sample through a lens.

When electrical currents flow through the two coils 2 and 3, the fluxes flowing between the two gaps 8 and 15 get added together. The result thereof, as shown in FIGS. 4 and 5, is that the final distribution of the axial magnetic field B(Z) is the linear combination of the distributions B1(Z) and B2(Z), respectively induced by the coils 2 and 3. In short, it is the adjustable curve B(z) that conditions the position of the resultant chief plane: its center O may be placed within the limits $O_1$ and $O_2$. Thus, its distance ZP with respect to the sample and the focal distance become variable and adjustable in broad limits, even in the case of a sample placed at the output of the lens with a constant working distance WD.

According to the illustration of FIG. 4, the conditions of this composition, where the fluxes get added to each other, are:
- the distance $O_1O_2$ should be equal to or smaller than the mean value of the widths (at mid-height) of the curves B1(Z) and B2(Z): this should be the case in such a way that the linear or added-up composition has no secondary maximum (which is a cause of aberrations).
- the distance $O_1O_2$ should remain big enough for the position of the highest point O of the curve B(Z) to be capable of being adjusted with a significant margin.

Finally, since the heights of the main planes (object and image) defined by the curve B(Z) are all very close to the highest point O, it is possible to apply the approximation for a thin lens and consider a resultant main plane giving the distance ZP of FIG. 5.

It is this possibility of causing variation in the distance ZP that enables an instrument provided with the lens having a variable focal distance according to the invention to be capable of working as a scanning electron microscope, an integrated circuit tester or a microscope, without its being necessary to modify the space WD between the front face of the lens and the sample to be tested.

Figures 6A, 6B:
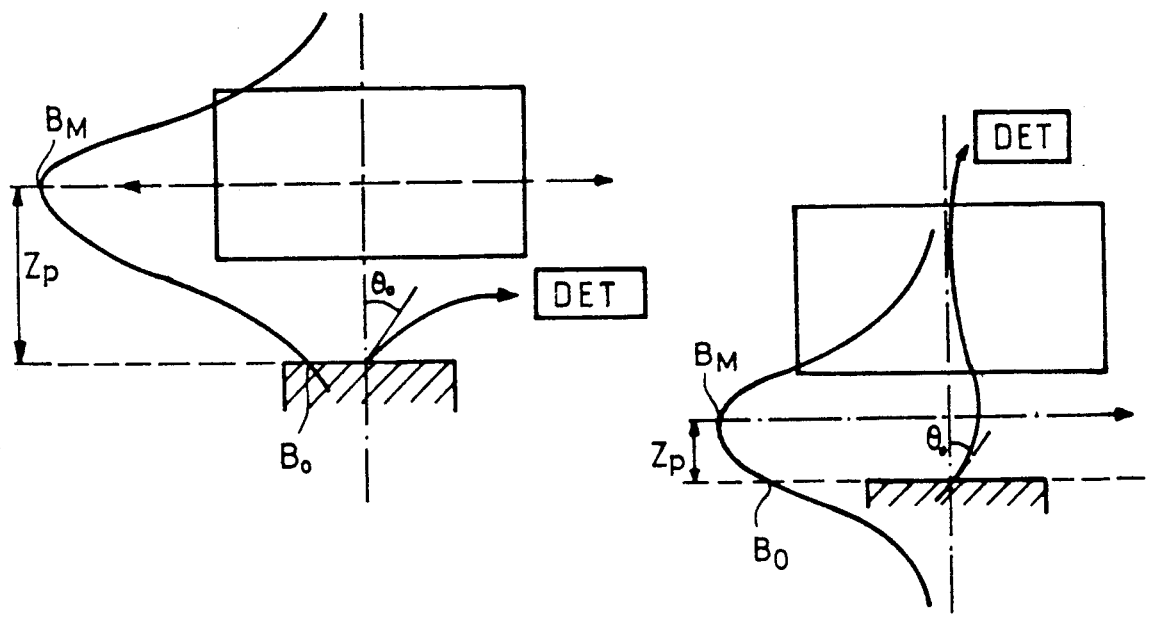
FIGS. 6a and 6b are two simplified drawings representing two possible positions of a detector with respect to the main plane of the lens with variable focal distance according to the invention.

In effect, an operation taking advantage of the arrangement shown in FIG. 6a is obtained easily by placing the chief plane of the lens far from the surface of the sample. This case corresponds to a high value of the ratio Bm/Bo between the maximum magnetic field and the magnetic field prevailing at the sample. This adjustment produces a great distance ZP enabling a large scanning surface, and it also obliges every secondary electron leaving the surface of the sample at an initial angle $\theta o$ (an inclination with respect to the optical axis 1) to follow a trajectory that diverges increasingly from the optical axis before penetrating a detector DET placed near the sample. This setting corresponds to a setting of the coil 2 which is far greater than that of the coil 3. However, an operation for a very different arrangement is also possible: this is the case of FIG. 6b where the detector DET and sample are on either side of the lens. The corresponding setting is the one giving a ratio Bm/Bo close to one. This condition gives a small distance Zp and restricts the inclination $\theta$ by magnetic confinement. Thus, the trajectories of the electrons going through the lens approach the optical axis 1. A large number of electrons transmitted by the sample are directed along the optical axis 1 to reach the detector. Finally, either mode of operation, as well as the intermediate mode of operation corresponding to FIG. 4 (O between the limits $O_1$ and $O_2$) can all be used in the instruments working with both types or either type of electron detector: scanning electron microscope (SEM); electron probe micro-analyzer (EPMA) or integrated circuit testers using electronic probes.

Figure 7:
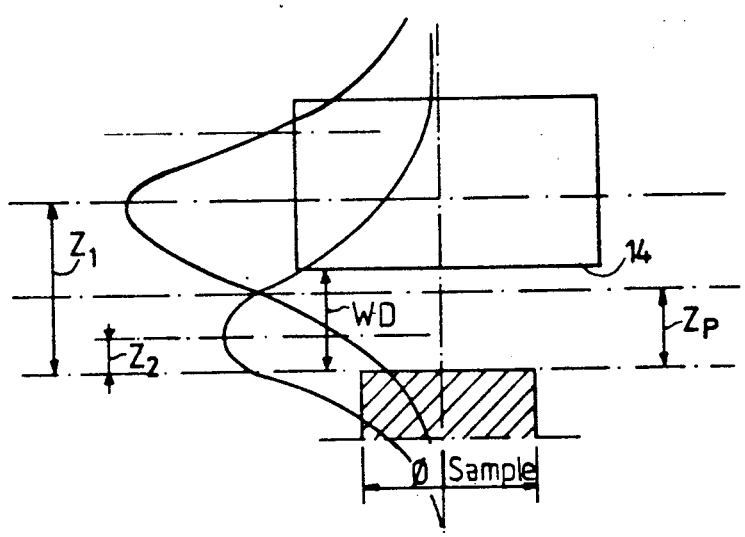
FIG. 7 shows the latitude of setting of the main plane of the lens with variable focal distance according to the invention.

The latitude of the corresponding setting is shown schematically in FIG. 7. The fact of being able to cause variation in the distance ZP of the chief plane with respect to the sample also makes it possible to obtain variable enlargements which could be very great in the scanning electron microscope mode without its being necessary, as is done for prior art microscopes, to modify the distance WD between the sample and the front face of the lens. Also, the lens according to the invention enables very great working distances WD, of some tens of millimeters for example, whether the detections take place through the lens or between the lens and the sample. Furthermore, since the samples are placed before the front pole piece 6, their dimension is not restricted by the physical dimensions of the lens and it is consequently possible to test samples with very large diameters.

What is claimed is:

1. A composite electromagnetic lens with variable focal distance wherein the working distance between the object or the sample to be observed and a second lens remains more or less fixed when the focal distance varies, comprising:

a first shielded lens coupled to said second single-pole lens, the two lenses being crossed by one and the same central channel extending around an optical axis, common to both lenses, to enable the passage of electrified particles going towards or coming from an object or sample to be observed through the first and second lenses coil to shift the position on the optical axis of the resultant composite lens as a function of the excitation current of the induction coils of the first and second in which said first shield lens has a first magnetic circuit formed by a front pole piece and a rear pole piece fixed inside a common magnetic cylindrical body having the optical axis as longitudinal axis said front pole piece and rear pole piece being crossed by the central channel and being separated at the place they are crossed by a first annular gap having a plan direction perpendicular to the optical axis, and in which said front pole piece has the form of truncated cone to form with the common magnetic cylindrical body a second magnetic circuit, for the second lens having a second annular gap surrounding the central channel, said first and second magnetic circuits being excited by first and second induction coils mounted respectively around the rear pole piece and the front pole piece to shift the position on the optical axis of the resultant composite lens as a function of the excitation current of the induction coils of the first and second lenses, first and second lenses having positions on the optical axis at the place where their field of induction is the maximum, and being excited by first and second induction coils in such way that the distance between the first lens and the second lens is equal to or small than the mean value of the widths at mid-height of the axial field curve, so that the resultant curve of the linear combination of the axial fields does not include any secondary maximum.

2. A lens according to claim 1, wherein the front pole piece has the shape of a truncated cone and has a support lying on a flank of the first coil to enable the first coil to be moved away from the annular gap, in enabling the engagement, inside the front part, of the end of the rear pole piece inside the truncated cone.

3. A lens according to claim 1, wherein the second gap is demarcated by the two lips formed by the conical part of the front pole piece and the part of the cylindrical body facing it.

* * * * *